(12) United States Patent
Mizuno

(10) Patent No.: US 6,906,572 B2
(45) Date of Patent: Jun. 14, 2005

(54) SEMICONDUCTOR INTEGRATED CIRCUIT DEVICE

(75) Inventor: Hiroyuki Mizuno, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 90 days.

(21) Appl. No.: 10/792,720

(22) Filed: Mar. 5, 2004

(65) Prior Publication Data

US 2004/0169535 A1 Sep. 2, 2004

Related U.S. Application Data

(63) Continuation of application No. 10/105,362, filed on Mar. 26, 2002, now Pat. No. 6,720,815, which is a continuation of application No. 09/437,267, filed on Nov. 10, 1999, now Pat. No. 6,396,323.

(30) Foreign Application Priority Data

Nov. 10, 1998 (JP) ............................................ 10-318691

(51) Int. Cl.[7] ................................................ H03K 3/00
(52) U.S. Cl. ...................... 327/295; 327/293; 327/564
(58) Field of Search .......................... 327/292–3, 295–7, 327/564–565, 202, 156; 331/1 A, 17, 25; 326/96, 101

(56) References Cited

U.S. PATENT DOCUMENTS

| | | |
|---|---|---|
| 4,612,510 A | 9/1986 | Lawton |
| 4,783,791 A | 11/1988 | Yoshino |
| 4,825,300 A | 4/1989 | Omori |
| 5,093,750 A | 3/1992 | Park et al. |
| 5,142,377 A | 8/1992 | Moriyama et al. |
| 5,239,206 A | 8/1993 | Yanai |
| 5,255,257 A | 10/1993 | Bryant et al. |
| 5,416,861 A | 5/1995 | Koh et al. |
| 5,422,915 A | 6/1995 | Byers et al. |
| 5,430,397 A | 7/1995 | Itoh et al. |
| 5,485,490 A | 1/1996 | Leung et al. |
| 5,570,045 A | 10/1996 | Erdal et al. |
| 5,621,692 A | 4/1997 | Lin |
| 5,703,537 A | 12/1997 | Bland et al. |
| 5,751,665 A | 5/1998 | Tanol |
| 5,923,385 A | 7/1999 | Mills et al. |
| 6,115,443 A | 9/2000 | Wu et al. |
| 6,118,316 A | 9/2000 | Tamamura et al. |
| 6,396,323 B1 | 5/2002 | Mizuno |

FOREIGN PATENT DOCUMENTS

| | | |
|---|---|---|
| JP | 03-161815 | 7/1991 |
| JP | 09-034584 | 2/1997 |

OTHER PUBLICATIONS

Yabe, T., "A Configurable DRAM Macro Design for 2112 Derivative Organizations to be Synthesized Using a Memory Generator", *1998 IEEE International Solid–State Circuits Conference,* Digest of Technical Papers, TP5.1, pp. 72–73, USA.

Saeki, T., *"The Direct Skew Detect Synchronous Mirror Delay (Direct SMD) for ASICs"*, 1998 Custom Integrated Circuits Conference, pp. 511–514, USA.

Primary Examiner—Timothy P. Callahan
Assistant Examiner—An T. Luu
(74) Attorney, Agent, or Firm—Antonelli, Terry, Stout & Kraus, LLP

(57) ABSTRACT

In integrated circuit (IC) devices, skew concerns between the clock pulses supplied to different latches hinder high speed operation. An IC device therefor includes a first clock processor means to generate a third clock pulse in response to first and second clock pulses with identical phase and frequency, a second clock processor means to generate a fifth clock pulse in response the third clock pulse and a fourth clock pulse with identical phase and frequency, and first and second latch groups each including a plurality of latches, in which the second clock pulse is generated via a buffer or divider from the third clock pulse, a fourth clock pulse is generated via a buffer or divider from the fifth clock pulse, and the third and fifth clock pulses are supplied to the first and second latch groups via a buffer, respectively.

15 Claims, 8 Drawing Sheets

■ =CLOCKED CIRCUIT ( E.G. LATCH, FLIP-FLOP OR REGISTER )

■ =CLOCKED CIRCUIT (E.G. LATCH, FLIP-FLOP OR REGISTER)

▨ =CLOCKED CIRCUIT (E.G. LATCH, FLIP-FLOP OR REGISTER)

◁ =CLOCK BUFFER

■ =CLOCKED CIRCUIT ( E.G. LATCH, FLIP-FLOP OR REGISTER )

◁ = CLOCK BUFFER

☒ =CLOCKED CIRCUIT (E.G. LATCH, FLIP-FLOP OR REGISTER)

SEMICONDUCTOR INTEGRATED CIRCUIT DEVICE

This application is a continuation of U.S. appln. Ser. No. 10/105,362 filed Mar. 26, 2002, now U.S. Pat. No. 6,720,815, which, in turn, is a continuation of U.S. appln. Ser. No. 09/437,267 filed Nov. 10, 1999 (now U.S. Pat. No. 6,396,323), the entire disclosures of which are hereby incorporated by reference.

BACKGROUND OF THE INVENTION

1. Field of the Invention

This invention relates to a semiconductor integrated circuit device and relates in particular to a semiconductor integrated circuit device having a high speed clock distribution network. This invention further relates to a technology capable of a high speed clock distribution network that efficiently utilizes design resources of independently designed semiconductor circuits.

2. Description of Related Art

FIG. 2 shows an example of a semiconductor integrated circuit device utilizing a high speed clock distribution network of the prior art. In the figure, the reference numeral 101 denotes a phase locked loop (PLL), 102 is a clock distribution line and 103 is a clock buffer. Reference numeral 120 denotes an input clock which is multiplied (increased) N times by the PLL 101 and output frequency to 102 as a multiplied (increased) by N times. The clock pulse multiplied by PLL 101 is amplified in 103 and distributed to each latch (latch and flip-flops are different from each other in the strict sense of the word, however here both latch and flip-flops are represented by the word "latch") with an equivalent delay. Technical features assuring an equal-length wiring are utilized in order to achieve an equivalent distributed delay.

Once of the distributed clocks 104 is input to the PLL 101 and the PLL 101 functions to obtain an identical phase for the clocks 104 and 120.

FIG. 3 shows the clock distribution network for the semiconductor integrated circuit device of FIG. 2 when added with a macro 130a and 130b. A macro is a separately designed circuit that satisfies specifications for circuits other than the macro (hereafter referred to as mother circuits) as well as interface specifications between macro and mother circuit. As long as these interface specifications are satisfied, the macro can change the mother circuit in various ways.

As one example, the DRAM macro has a memory function to store information by means of capacitance in a circuit described in the 1998 IEEE International Solid-State Circuit Conference Digest of Technical Papers, pp. 72–73.

These macro circuits are sometimes designed as separate items by different designers. One designer may specialize in DRAM macro design while another may specialize in coprocessor macro design. A circuit can then be systematically assembled by combining the macros obtained from these different sources. This method allows utilizing existing macros to design system-level integration devices with high additional value.

In the macro, software IP is used to show design data at the circuit level, and hardware IP is data listing the physical structure of the semiconductor integrated circuit device such as the layout. Hardware IP is more appropriate when high speed operation is required, because performance cannot otherwise be guaranteed when redrafting the physical layout of the circuit.

The clocks distributed to the mother circuit latches are also supplied at an identical phase to the latches in the circuits 121 and 122. The respective macros 130a and 130b distribute the clock pulses input from 121 and 122 to the latches within each macro at an equivalent delay by utilizing the clock buffers 133a and 133b within each macro.

The clock distribution in the semiconductor integrated circuit device of FIG. 3 containing the macros is at a phase identical to the clock phase of 121 and 122 and the latch phase within each mother circuit. However, a delay time Tm is required from 121 and 122 to the input of the clocks to the latches within each macro so that a phase difference (skew) equivalent to the Tm, occurs between the latches within the mother circuit and the latches within the macros.

Further, the Tm within each macro is different so that skew also occurs between macros. This Tm tends to become large when using large scale macros (also called megacells) and the clock skew increases in the semiconductor integrated circuit device using these macros.

In the semiconductor integrated circuit devices of the prior art containing these macros, skew occurs between the clock pulses supplied to the latches within the mother circuit and the clock pulses supplied to the latches within the macro. These clock skews interfere with the high frequency function of the semiconductor integrated circuit device clock frequency so that the semiconductor integrated circuit device cannot be operated at high speed.

A proper delay time for the clock distribution network, from the clock buffer 103 to 121 or 122 calculated during the macro design stage, that takes the Tm into account will resolve this problem but has the drawback that macrocell design cannot be performed independently of mother circuit design.

SUMMARY OF THE INVENTION

In order to resolve the above mentioned problems, this invention has a clock generator to supply clock signals, a plurality of first controlled circuits supplied by the clock pulses from the clock generator and a phase adjuster for these clock signals, a second controlled circuit supplied by the clock signal that passed through the clock signal phase adjuster, and configured so that the clock phase input to this clock signal phase adjuster and first controlled circuit are an identical phase.

The number of first controlled circuits supplied at this time by clock pulses from the clock generator is typically larger than the number of clock signal phase adjuster (circuits).

This invention in this case, is characterized in having a clock generator to supply clock signals, a plurality of first controlled circuits supplied by the clock pulses from the clock generator and a phase adjuster for these clock signals, a second controlled circuit supplied by the clock signal that passed through the clock signal phase adjuster, and further characterized in that the number of the plurality of first controlled circuits supplied by clocks from the clock generator is larger than the number of clock signal phase control circuits.

To restate, this invention is characterized in that the percentage shared by first control circuits from among the fan-out of the clock generator is larger than the percentage of clock signal phase control circuits.

A phase adjusting means contains a phase frequency detector to compare the frequencies input with the first clock and the second clock, and is configured to output the three clock signals controlled by the output of the phase frequency detector.

In a more detailed description, the semiconductor integrated circuit device of this invention has a first clock processing means to input a first clock and a second clock and generate a third clock, a second clock processing means to input a third clock and a fourth clock and generate a fifth clock, and a first latch group and a second latch group comprised of at least one latch, wherein the second clock is generated from the third clock by way of a buffer, the frequency of the second and third clocks are identical, the first clock processing means generates the third clock so that the first and second clocks will have an identical phase and frequency, a fourth clock is generated by way of a buffer from the fifth clock, the frequency of the fourth and fifth clocks are identical, the second clock processing means generates a fifth clock so that the third and fourth clocks will have an identical phase and identical frequency, the third clock is supplied by way of a buffer to the first latch group, the fifth clock is supplied by way of a buffer to the second latch group, and the first latch group and the second latch group operate at an identical phase.

Phrases such as "identical phase, identical frequency" as related in these specifications, allow for an error of an extent that can be ignored without hindrance to actual operation and can be tolerated in terms of performance demanded of the circuit.

The first clock processing means of this invention as described in a more detailed example, consists of a phase frequency detector to input a first clock and a second clock and output a first error signal, a charge pump circuit to input a first error signal and output a second error signal, a low-pass filter to input a second error signal and output a third error signal, and a voltage-controlled oscillator to change the oscillator frequency according to the third error signal. The third clock is capable of being generated by the voltage-controlled oscillator.

This invention is especially effective when making a single circuit such as semiconductor integrated circuits (chips) by combining a plurality of circuits from different sources (different designers and design companies).

In other words, a circuit design method for reading out a first circuit block of design data from a recording medium in which is stored the first circuit block of design data, and integrating this with a second circuit block of design data as design data for a signal semiconductor integrated circuit device and characterized in that a phase adjuster means inserts a clock signal between the first circuit block and the second circuit block. Utilizing this circuit design method eliminates the problem of clock phase deviations throughout the entire circuit.

A circuit design method to prepare design data for a first circuit block having a clock output terminal to output a clock signal, and having a circuit to adjust the phase of the clock signal sent from the clock output terminal, and combined with design data for a second circuit block, wherein the clock output terminal of the first circuit block is connected to the clock input terminal of the second circuit block. Utilizing this method, a clock phase correction means is prepared beforehand for the circuit forming the mother circuit so that the load imposed is reduced when circuits are combined.

In a separate configuration, a clock phase adjuster means can be internally incorporated onto the circuit block that is to be added. By distributing design data for this kind of circuit, the purchaser can join and integrate circuits to achieve a circuit system of high additional value without having to worry about clock deviations between circuits.

This kind of design data is characterized in that it can be stored on a record medium such as a CD-ROM that stores circuit design data such as for circuits having a clock input terminal for receiving clock signals, circuits to adjust the clock signal phase sent from the clock input terminal, and internal circuits controlled by the adjusted clock signals. This circuit design data can then be distributed while stored on the CD-ROM.

For design data, a variety of items (so-called software IP) are available to show circuit electrical connections (so-called circuit schematics) or items (so-called hardware IP), such as to show physical scales, layouts, and material specifiers are available when the actual semiconductor integrated circuit device has been achieved. The data may be shown numerically or in a graphical form.

The circuits described with this kind of design data often describe only a portion of a single circuit device (such as a chip) however the signal exchange with external circuits is mostly performed by the metal level formed on the board substrate. The data for these portions of the circuit can be confirmed using hardware IP.

Instead of distributing this kind of data by CD-ROM as previously mentioned, the Internet can be used. In such cases, a recording medium to store circuit design data such as for circuits having a clock input terminal for receiving clock signals, circuits to adjust the clock signal phase sent from the clock input terminal, and internal circuits controlled by the adjusted clock signals, can be prepared beforehand and when data transfer is requested by a user, the circuit data stored on the recording medium can be sent to the user. If progress is made on setting up a proper infrastructure, then the Internet distribution method may prove more convenient than distribution by CD-ROM.

The main means utilized in this invention for resolving the above mentioned problems in the semiconductor integrated circuit device are a first clock processing means to input a first clock and a second clock and generate a third clock so that the first and second clocks will have identical phases and identical frequencies, a second clock processing means inputs a third clock and a fourth clock and generates a fifth clock so that the third and fourth clocks will have identical phases and identical frequencies, and a first latch group and a second latch group comprised of a plurality of latches wherein a second clock is generated from a third clock by way of a buffer or divider, a fourth clock is generated from a fifth clock by way of a buffer or divider, the third clock is supplied by way of a buffer to the first latch group and the fifth clock is supplied by way of a buffer to the second latch group.

DETAILED DESCRIPTION OF THE PREFERRED EMBODIMENTS

Figure 1:
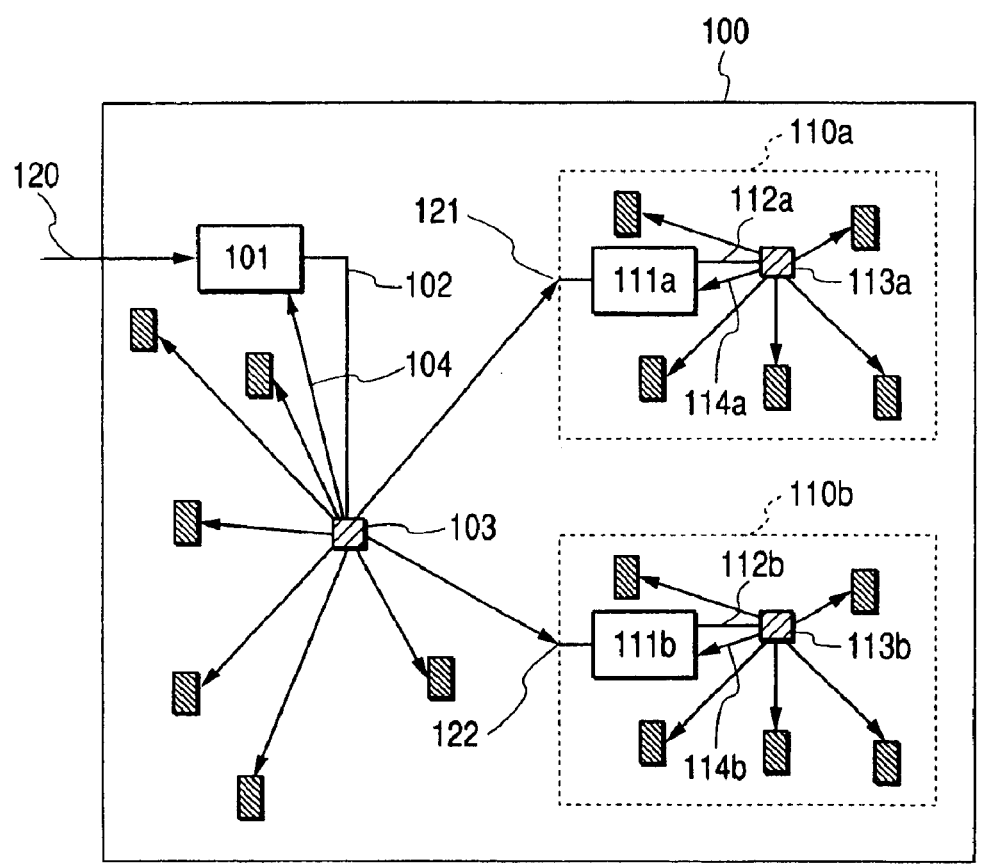
FIG. 1 is block diagram showing the embodiment of this invention.
Figure 2:
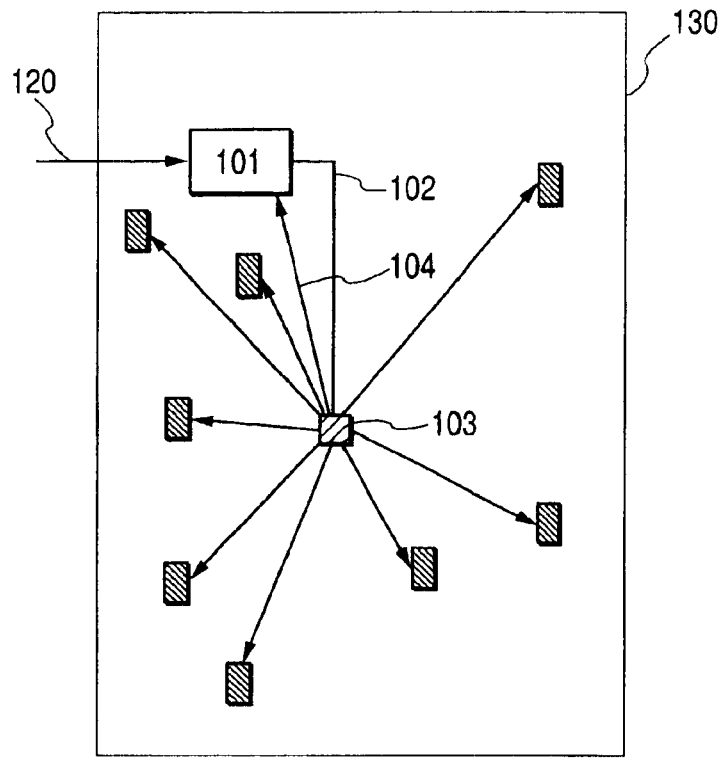
FIG. 2 is a concept view showing the clock distribution network of the prior art.
Figure 3:
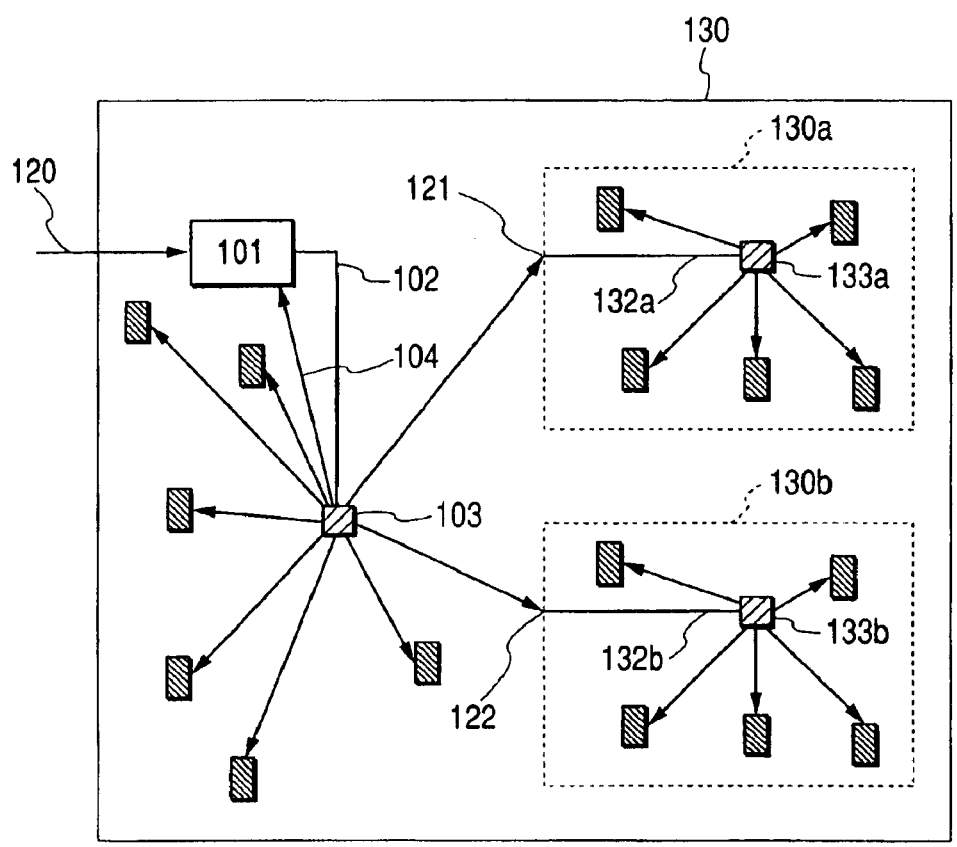
FIG. 3 is a block diagram showing the clock distribution network for describing the issues of this invention.

The embodiment of this invention is shown in FIG. 1. A comparison with FIG. 3 shows that phase adjusters 111a and 111b have been added to the macro 110a and 110b.

This example assumes the customer is purchasing block (macro) design data 110a, 110b by means of an IP provider for addition to circuits at the customer's company. The design data can be procured from a CD-ROM or on-line data. In this example, the phase adjusters 111aa and 111b have been added to the design data from the IP provider.

The phase adjusters 111a issues a clock 112a from the clock input from 121. The clock 112a is amplified in the clock buffer 113a and distributed at the same phase to each latch within the macro. The clock is distributed to the phase adjusters 111a in the same way by the clock 114a. The phase adjuster 111a issues a clock 112a so that the clock 114a and the clock 121 have an identical phase.

An identical phase can therefore be achieved for the clock 121 and the input clock to each latch within the macro. The clock within the macro 110b can be made to operate the phase adjuster 111b in the same way as the phase adjuster 111a and the input clocks for each latch inside the macro 110b and the clock 122 given an identical phase. In this way, the latch within each macro and the mother circuit latches can be operated at the same phase in the semiconductor integrated circuit device 100 containing the macro 110a and 110b. Even if the macros of a mother circuit are changed, the phase adjusters 111a and 111b will keep the latches within each macro and the latches of each mother circuit operating at the same phase.

Figure 8:
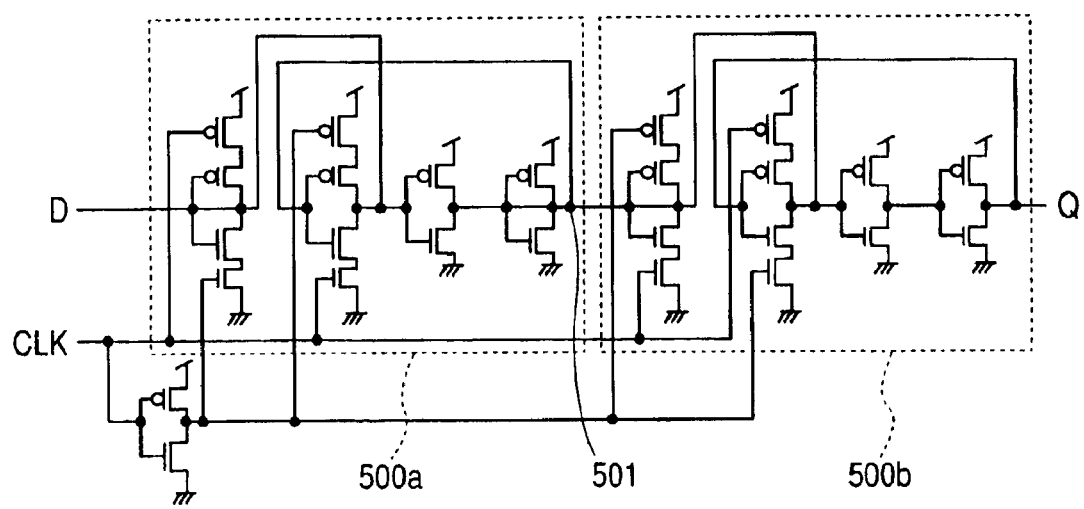
FIG. 8 is a circuit schematic showing an embodiment of the latch.

FIG. 8 shows an embodiment of a latch. The latch consists of 26 transistors and in the figure, D Is the data input, Q is the data output, CLK is the clock pulse. This latch is comprised of a master section shown by 500a and a slave section shown by 500b. When the clock is low or "L" the data input by D in the master section 500a is output unchanged to the node 501. The slave section 500b continually outputs the data held, to the Q regardless of the level of the node 501. Next, when the clock sets to "H" or high, the master section 500a holds the previous data in the node 501 regardless of the D level. The slave section 500b outputs the data of the node 501 to Q. In this way, the latch of FIG. 8 latches the D data at Q and outputs it the instant that the clock "L" transits from "L" to "H". (Strictly speaking, the circuit of Fig, 8 is not a latch but is actually a flip-flop, no distinction between those two names is made here.)

There are no particular restrictions on the method for distributing clock pulses at an identical phase to each latch from the clock buffers 103, 113a and 113b. The H-tree method may be used and the mesh method may be used.

Figure 4:
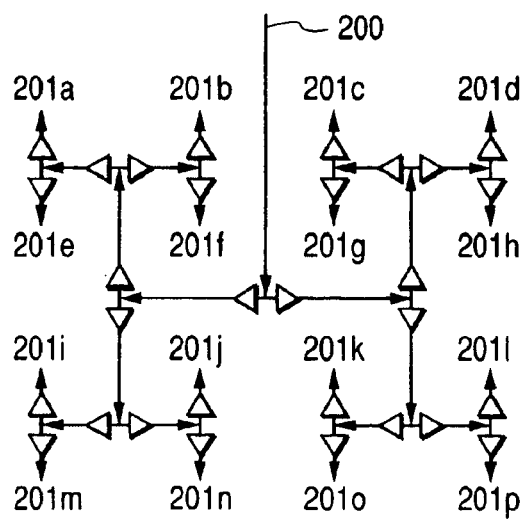
FIG. 4 is a block diagram showing the H-tree type clock distribution network.

FIG. 4 is an example showing use of the H-tree method. The clocks input from 200 can be distributed as clock pulses at an identical phase to nodes 201a through 201p.

Adjusting the lines to the same length is the generally used method for identical phase clock distribution. As low a resistance as possible is needed when selecting a (wire) line material for the clock. In recent years, copper has come to be used as the material for metallic wiring lines so copper wiring line is preferred for the clock signal line.

Figure 7:
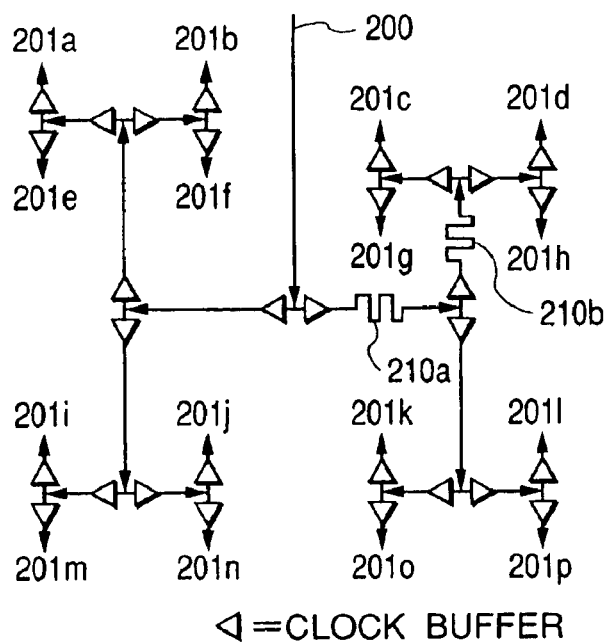
FIG. 7 is a block diagram showing the wire length adjusting section in the H-tree type clock distribution network.

FIG. 7 shows an example when a wire-length adjuster for zero-skew clock routing 210a and 210b are added in the H-tree method of FIG. 4. Generally, adjusting the wire lengths to an equivalent length is difficult regardless of whether the H-tree method is used. In such cases, adding a wire-length adjuster for zero-skew clock routing 210a and 210b as shown in FIG. 7 will enable the proper adjustment.

In the embodiment in FIG. 1, the phase adjuster circuits 111a and 111b have been added to the macro 110a and 110b. This kind of method is utilized by the provider (designer) of the macro to eliminate clock skew.

Figure 9:
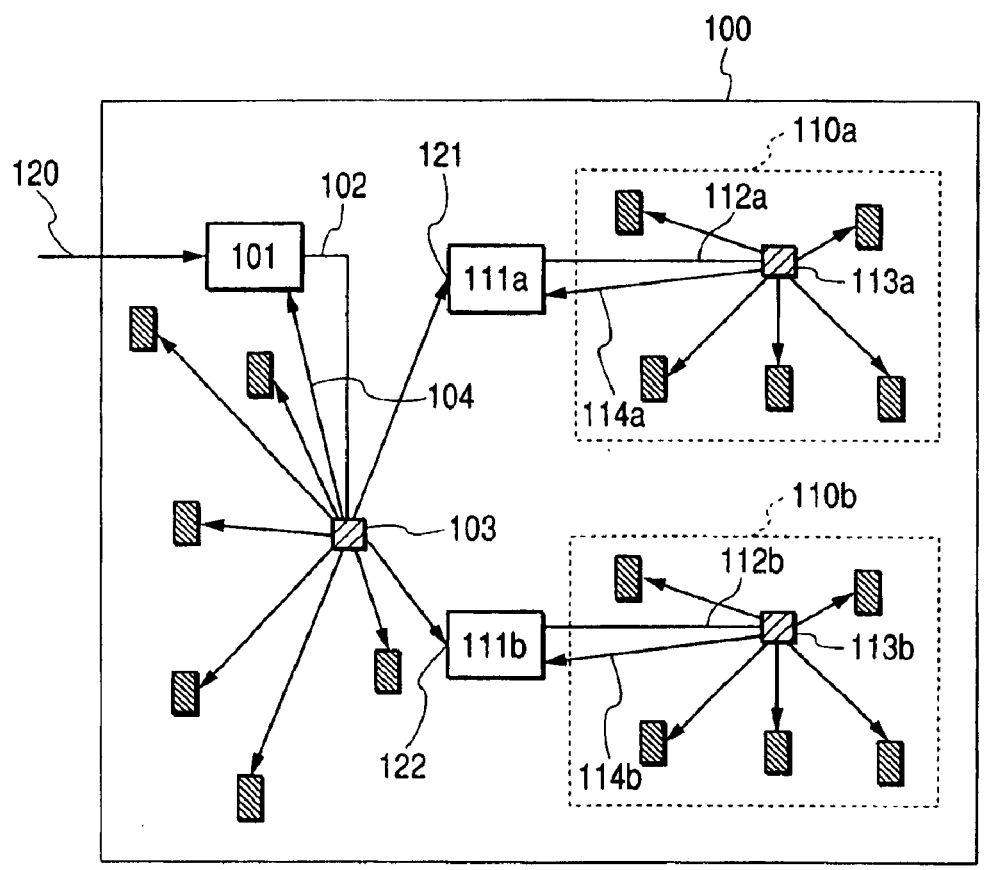
FIG. 9 is a block diagram showing another embodiment.

Another configuration is shown in FIG. 9. This configuration is designed to counteract clock skew on the system side composed of macros. In FIG. 9, the phase adjuster circuits 111a and 111b have been added externally to the macros 110a and 110 b.

Providing each macro with a phase adjuster as in the case of FIG. 1 has the advantage of making design of the mother circuit simple. On the other hand, if the configuration of FIG. 9 is used, providing a terminal for output to the mother circuit from the feedback clock 114a or 114b in each macro is required however since a phase adjuster is no longer needed for each macro, this configuration has the advantage that macro design is simple.

Generally, clock skew is not much of a problem in most cases when using macros at clock frequencies with low speeds. In such cases, the phase adjuster is not required inside the macro as was shown in FIG. 1. In contrast, in FIG. 9, a phase adjuster can be installed as needed in the mother circuit so that utilization of space is improved.

There are no particular restrictions on the structure of the PLL 101. The so called DLL structure may be used, and an SMD (synchronous mirror delay) such as shown in the IEEE 1998 Custom Integrated Circuits Conference, pp. 511–514 may also be used. When the SMD is used for 101 shown in FIG. 1, a portion of the SF40 does not have a feedback function and appears not to be applicable to the structure of FIG. 1. However, even in this case, a dummy clock buffer is usually contained internally and if the output from this dummy clock buffer is considered as the clock feedback, then the structure can be considered equivalent to the structure of the drawing of this invention in FIG. 1.

Figure 5A:
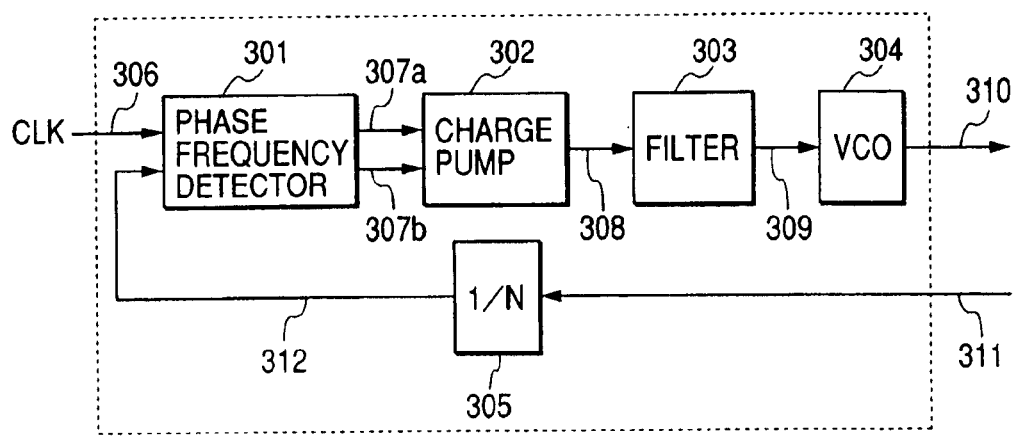
FIG. 5 is a block diagram showing the embodiment of the PLL.
Figure 5B:
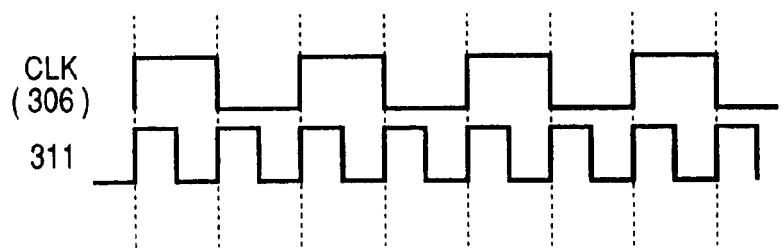

An embodiment of the PLL 101 (phase locked loop) is shown in FIG. 5. Clock CLK 306 is a clock that is input externally. In the figure, 301 is a phase frequency detector, 302 is a charge pump, 303 is a low-pass filter, 304 is a voltage-controlled oscillator and 305 is a divider. Details of the respective circuits are omitted here.

The difference in the phase and frequency between the clock 306 and the internal clock 312 are compared in the phase frequency detector 301 and output as the error signals 307a and 307b. These error signals are converted to analog signals in the charge pump 302 and after removing the high frequency component of these error signals with the low-pass filter 303 are input as an oscillator frequency control signal 309 to the voltage-control oscillator 304. The oscillator output from the voltage-control oscillator 304 is supplied as a clock 310 to the clock distribution network of the mother circuit. The clock 311 from the clock distribution network is frequency divided in a divider 305, and then input to the phase frequency detector 301.

The phase of the clock 306 and an internal clock 306 are synchronized by means of the phase synchronous loop 101, and the frequency of the clock 310 is divided several times according to the frequency division rate per the clock 306 of the divider 305. FIG. SB shows the operation waveforms when the frequency division rate of the divider 305 is two.

There are no particular restrictions on the structure of the phase adjuster 111. The structure may be the so-called PLL or DLL (delay locked loop) or an SMD (synchronous mirror delay) structure may be used. Using an SMD structure allows a digital circuit configuration so that the phase adjuster can be comprised of a combination of logic circuits, having the beneficial effect that implementing the desired circuit is easy.

When SMD (synchronous mirror delay) is used for the phase adjuster 111 of FIG. 1, a portion of the SMD does not have a feedback function and does not appear to be applicable to the structure of FIG. 1; However, even in this case, a dummy clock buffer is usually contained internally and if the output from this dummy clock buffer is considered as the clock feedback, then the structure can be considered equivalent to the structure of the drawing of this invention in FIG. 1.

Figure 6A:
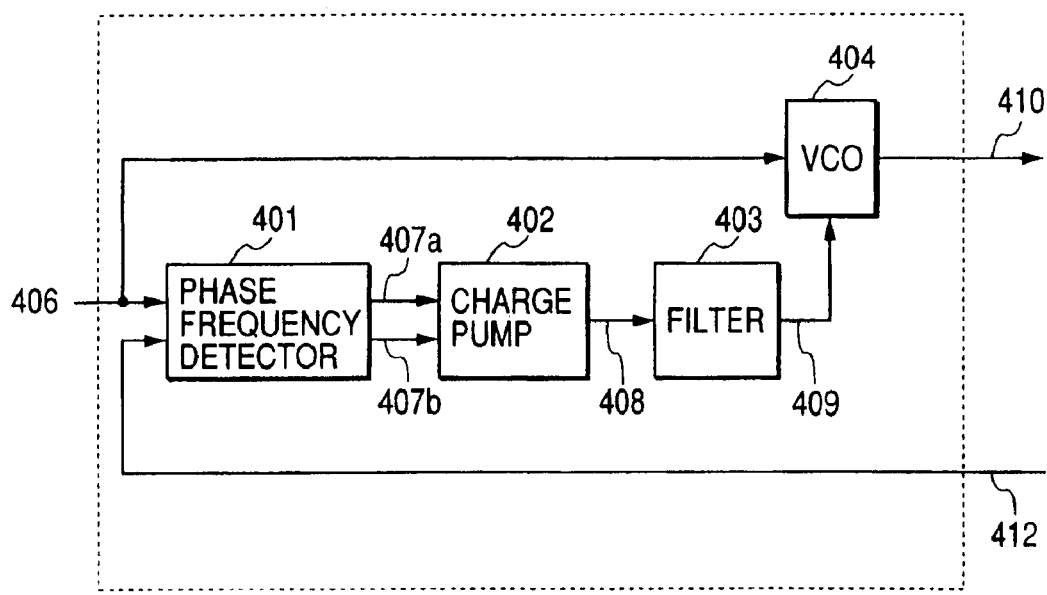
FIG. 6 is a block diagram showing the embodiment of the DLL.

FIG. 6 shows an example of the phase adjuster 111a or 111b configured with a DLL (delay locked loop) structure.

The reference numeral 406 in FIG. 6 is an externally input clock. The reference numeral 401 is a phase frequency detector, 402 is a charge pump, 403 is a low-pass filter and 404 is a voltage-controlled delay line. Details of the respective circuits are omitted here.

The difference in the phase and frequency between the clock 406 and the internal clock 412 are compared in the phase frequency detector 401 and output as the error signals 407a and 407b. These error signals are converted to analog signals in the charge pump 402 and after removing the high frequency component of these error signals with the low-pass filter 403 are input as a delay control signal 409 to the voltage-control oscillator 404. The oscillator output of the voltage-control oscillator 404 is supplied as a clock 410 to the clock distribution network inside the macro. The clock 412 from the clock distribution network is input to the phase frequency detector 401.

Figure 6B:
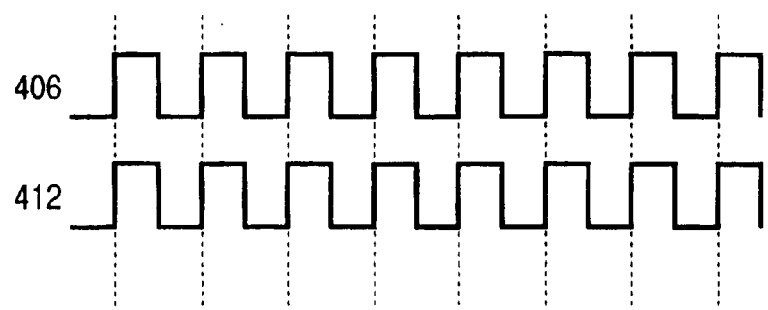

A clock 410 is issued by the phase adjuster 111 to synchronize the phase of the clock 406 and the internal clock 412. The operation waveforms are shown in FIG. 6B.

Figure 10:
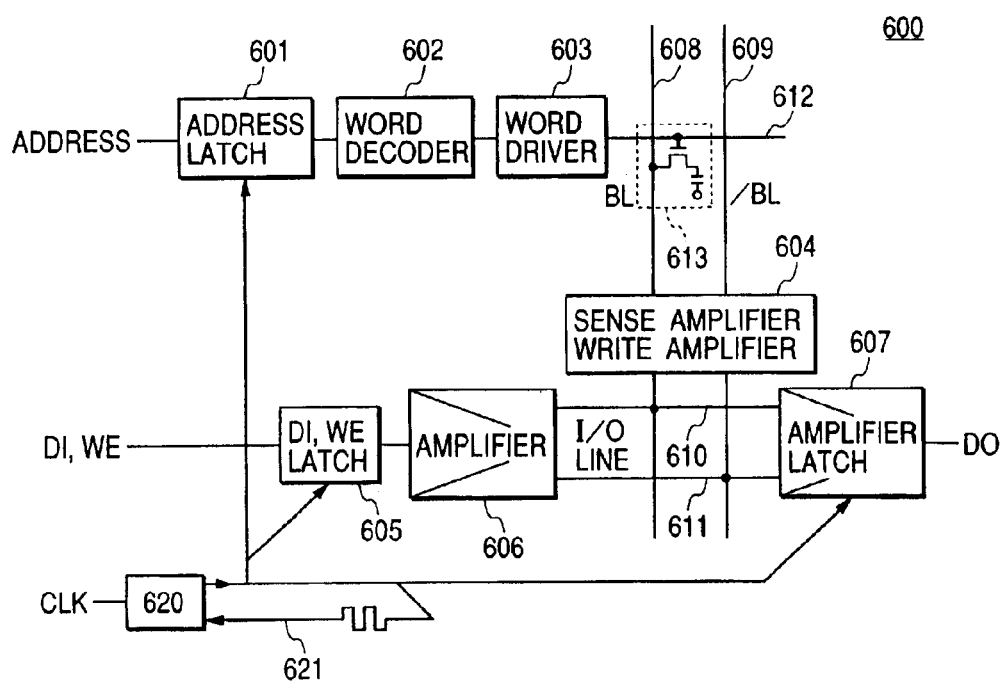
FIG. 10 is a block diagram showing an embodiment of the DRAM macro.

FIG. 10 shows an example of the macro. The example in FIG. 10 is a dynamic memory in a pipeline configuration C. In this figure, 601 is an address latch, 602 is and address decoder, 603 is an address driver, 604 is a sensing amplifier and write amplifier, 605 is an input data DI latch, 606 is a write buffer, 607 is an I/O line amplifier to amplify the signals of I/O lines 610 and 611, 608 and 609 are bit lines for B-L and /BL, 610 and 611 are I/O lines, 612 is a word line, and 613 is a memory cell. After the clock CLK passes the phase adjuster 620, it is input at an identical phase to the address latch 601, the input data DI latch 605 and the I/O line amplifier 607. The reference numeral 621 denotes a clock feedback line equivalent to the clock 114a of FIG. 1, a clock at an identical phase for 601, 605 and 607 is input to the phase adjuster 620.

During read, after the address latched in the address latch 601 has been decoded, one address is selected and asserted in the word line 612. The information output from the bit line BL, /BL is amplified in the sensing amplifier 604. The amplified memory cell data is latched in 607 at the next clock and the amplifier latch 607 outputs as the output data DO.

During write, after the address latched in the address latch 601 has been decoded, one address is selected and asserted in the word line 612. The write data is simultaneously latched in the input data DI latch 605 and the write buffer 606 drives the bit line BL, /BL. Writing is then performed onto the memory cell by this operation.

In the above two operations, the precharge operation such as for the bit lines BL, IBL and I/O lines, is omitted.

The clock phase supplied to each latch in the address switch 601, the input data Dl latch 605, and the I/O line amplifier 607 is made to match the clock phase of the mother circuits using the dynamic memory of FIG. 10, by means of the clock distribution method of this invention.

This invention therefore renders the effect in a semiconductor integrated circuit device containing macros that the clock supplied to the latches inside the mother circuits and the clock supplied to the latches in the macro both have an identical phase.

What is claimed is:

1. A semiconductor integrated circuit device comprising:

a first circuit including first latches;

a second circuit including second latches;

a phase locked loop to output a first clock signal;

a phase adjusting circuit to output a second clock signal;

first clock distribution lines to distribute the first clock signal to said first latches and to said phase adjusting circuit; and second clock distribution lines to distribute the second clock signal to said second latches;

wherein the phase locked loop receives a reference clock signal and the first clock signal distributed via the first clock distribution lines and controls a phase of the first clock signal outputted to synchronize the reference clock signal and the first clock signal distributed via the first clock distribution lines, and wherein the phase adjusting circuit receives the first clock signal distributed via the first clock distribution lines and the second clock signal distributed via the second clock distribution lines and controls a phase of the second clock signal outputted to synchronize the first clock signal distributed via the first clock distribution lines and the second clock signal distributed via the second clock distribution lines.

2. A semiconductor integrated circuit device according to claim 1, wherein said phase adjusting circuit has a digital circuit configuration.

3. A semiconductor integrated circuit device according to claim 1, wherein the first clock signal is distributed to the first latches, to the phase locked loop and to the phase adjusting circuit with identical phase, wherein the second clock signal is distributed to the second latches and to the phase adjusting circuit with identical phase, wherein the phase locked loop adjusts a phase of the first clock signal so that the reference clock signal and the first clock signal, distributed via the first clock distribution lines, have identical phases, and wherein the phase adjusting circuit adjusts a phase of the second clock signal so that the first clock signal, distributed via the first clock distribution lines, and the second clock signal, distributed via said second clock distribution lines, have identical phases.

4. A semiconductor integrated circuit device according to claim 3, wherein any two of said clock signals having identical phases can tolerate an error therebetween that does not hinder operation in terms of performance demanded of said semiconductor integrated circuit.

5. A semiconductor integrated circuit device according to claim 1,
wherein each of the first latches includes a first data input node, a first clock input node, a first master section and a first slave section, the first master section holds data inputted from the first data input node when the first clock signal inputted to the first clock input node is in a first state, and the first slave section holds the data held by the first master section when the first clock signal inputted to the first clock input node is in a second state.

6. A semiconductor integrated circuit device according to claim 1,
wherein each of the second latches includes a second data input node, a second clock input node, a second master section and a second slave section, the second master section holds data inputted from the second data input node when the second clock signal inputted to the second clock input node is in a first state, and the second slave section holds the data held by the second master section when the second clock signal inputted to the second clock input node is in a second state.

7. A semiconductor integrated circuit device according to claim 1,
wherein each of the first latches includes a first data input node, a first clock input node, a first master section and a first slave section, the first master section holds data inputted from the first data input node when the first clock signal inputted to the first clock input node is in a first state, and the first slave section holds the data held by the master section when the first clock signal inputted to the first clock input node in a second state, and
wherein each of the second latches includes a second data input node, a second clock input node, a second master section and a second slave section, the second master section holds data inputted from the second data input node when the second clock signal inputted to the second clock input node is in a first state, and the second slave section holds the data held by the second master section with the second clock signal inputted to the second clock input node is in a second state.

8. A semiconductor integrated circuit device comprising:
a first plurality of stages of first clock buffers each amplifying a first clock signal;
a second plurality of stages of second clock buffers each amplifying a second clock signal;
a phase locked loop receiving a reference clock signal and the first clock signal amplified by the first clock buffers and outputting the first clock signal to the first stage of first clock buffers;
a phase adjusting circuit receiving the first clock signal amplified by the first clock buffers and the second clock signal amplified by the second clock buffers and outputting the second clock signal to the first stage of second clock buffers;
a first circuit including first latches, each connected to one of first clock buffers of a final stage of said first plurality of stages and receiving the first clock signal amplified by said first clock buffers; and
a second circuit including second latches, each connected to one of second clock buffers of a final stage of said second plurality of stages and receiving the second clock signal amplified by said second clock buffers,
wherein the phase locked loop controls a phase of the first clock signal outputted to synchronize the reference clock signal and the received first clock signal, and
wherein the phase adjusting circuit controls a phase of the second clock signal outputted to synchronize the received first clock signal and the received second clock signal.

9. A semiconductor integrated circuit device according to claim 8,
wherein said phase adjusting circuit has a digital circuit configuration.

10. A semiconductor integrated circuit according to claim 8,
wherein the phase locked loop is connected to one of said first clock buffers of a final stage of said first plurality of stages and receives the first clock signal amplified by said clock buffers,
wherein the phase adjusting circuit is connected to one of said second clock buffers of a final stage of said second plurality of stages and receives the second clock signal amplified by said second clock buffers,
wherein the first clock signal received by the phase locked loop has an identical phase with the first clock signal received by the phase adjusting circuit,
wherein the phase locked loop adjusts a phase of the first clock signal so that the reference clock signal and the first clock signal amplified by the first clock buffers have identical phases, and
wherein the phase adjusting circuit adjusts a phase of the second clock signal so that the first clock signal amplified by said first clock buffers and the second clock signal amplified by said second clock buffers have identical phases.

11. A semiconductor integrated circuit according to claim 8,
wherein the first clock signal received by the phase locked loop has an identical phase with the first clock signal received by each of the first latches, and
wherein the second clock signal received by the phase adjusting circuit has an identical phase with the second clock signal received by each of the second latches.

12. A semiconductor integrated circuit device according to claim 11,
wherein any two of said clock signals having identical phases can tolerate an error therebetween that does not hinder operation in terms of performance demanded of said semiconductor integrated circuit.

13. A semiconductor integrated circuit device according to claim 8,
wherein each of the first latches includes a first data input node, a first clock input node, a first master section and a first slave section, the first master section holds a data inputted from the first data input node when the first clock signal inputted to the first clock input node is in a first state, and the first slave section holds the data by the first master section when the first clock signal inputted to the first clock input node is in a second state.

14. A semiconductor integrated circuit device according to claim 8,
wherein each of the second latches includes a second data input node, a second clock input node, a second master section and a second slave section, the second master section holds data inputted from the second data input node when the second clock signal inputted to the second clock input node is in a first state, and the second slave section holds the data held by the second master section when the second clock signal inputted to the second clock input node is in a second state.

15. A semiconductor integrated circuit device according to claim 8, wherein each of the first latches includes a first data input node, a first clock input node, a first master section and a first slave section, the first master section holds data inputted from the first data input node when the first clock signal inputted to the first clock input node is in a first state, and the first slave section holds the data held by the first master section when the first clock signal inputted to the first clock input node is in a second state, and wherein each of the second latches includes a second data input node, a second clock input node, a second waster section and a second slave section, the second master section holds data inputted from the second data input node when the second clock signal inputted to the second clock input node is in a first state, and the second slave section holds the data held by the second master section when the second clock signal inputted to the second clock input node is in a second state.

* * * * *